United States Patent
Retz et al.

(10) Patent No.: US 9,108,387 B2
(45) Date of Patent: Aug. 18, 2015

(54) ELECTRICALLY CONDUCTIVE STRUCTURE

(75) Inventors: Kevin Matthew Retz, Bothell, WA (US); Alan Keith Prichard, Gig Harbor, WA (US)

(73) Assignee: THE BOEING COMPANY, Chicago, IL (US)

( * ) Notice: Subject to any disclaimer, the term of this patent is extended or adjusted under 35 U.S.C. 154(b) by 556 days.

(21) Appl. No.: 13/174,337

(22) Filed: Jun. 30, 2011

(65) Prior Publication Data

US 2013/0005208 A1 Jan. 3, 2013

(51) Int. Cl.
| | |
|---|---|
| *D03D 15/00* | (2006.01) |
| *B32B 5/26* | (2006.01) |
| *B32B 5/28* | (2006.01) |
| *B32B 5/22* | (2006.01) |
| *B32B 5/02* | (2006.01) |
| *D03D 1/00* | (2006.01) |
| *D03D 13/00* | (2006.01) |
| *H01L 51/00* | (2006.01) |
| *B64D 45/02* | (2006.01) |

(52) U.S. Cl.
CPC . *B32B 5/22* (2013.01); *B32B 5/024* (2013.01); *B32B 2262/106* (2013.01); *B32B 2307/202* (2013.01); *B64D 45/02* (2013.01); *D03D 1/0088* (2013.01); *D03D 13/00* (2013.01); *D03D 13/004* (2013.01); *D03D 15/0066* (2013.01); *H01L 51/0048* (2013.01); *Y10T 442/3065* (2015.04); *Y10T 442/3195* (2015.04)

(58) Field of Classification Search
None
See application file for complete search history.

(56) References Cited

U.S. PATENT DOCUMENTS

| | | | | |
|---|---|---|---|---|
| 3,596,657 | A * | 8/1971 | Eidus | 602/2 |
| 3,893,639 | A * | 7/1975 | Croswell, Jr. | 244/219 |
| 3,909,508 | A * | 9/1975 | Ross | 174/117 M |
| 4,725,485 | A * | 2/1988 | Hirokawa | 442/187 |
| 5,141,182 | A * | 8/1992 | Coffinberry | 244/209 |
| 5,279,892 | A * | 1/1994 | Baldwin et al. | 442/206 |
| 5,490,602 | A | 2/1996 | Wilson et al. | |
| 5,780,157 | A * | 7/1998 | Tuffias et al. | 428/408 |
| 6,418,974 | B1 * | 7/2002 | King | 139/383 R |
| 6,447,886 | B1 * | 9/2002 | Mohamed et al. | 428/209 |
| 6,492,980 | B2 * | 12/2002 | Sandbach | 345/173 |
| 6,500,515 | B1 | 12/2002 | Fantino et al. | |
| 7,337,810 | B2 | 3/2008 | Orr et al. | |
| 7,780,808 | B2 * | 8/2010 | Godbehere et al. | 156/166 |
| 2004/0211942 | A1 * | 10/2004 | Clark et al. | 252/500 |
| 2005/0211082 | A1 * | 9/2005 | Angeloni et al. | 87/3 |
| 2010/0021682 | A1 * | 1/2010 | Liang et al. | 428/103 |

FOREIGN PATENT DOCUMENTS

WO WO03049928 A1 6/2003

OTHER PUBLICATIONS

Machine translation of WO2010060593 Zhidong et al. Publishe Jun. 3, 2010.*
Extended European Search Report, dated Nov. 5, 2014, regarding Application No. EP12174286.0, 8 pages.

* cited by examiner

*Primary Examiner* — Elizabeth Cole
*Assistant Examiner* — Shawnda McKinnon
(74) *Attorney, Agent, or Firm* — Yee & Associates, P.C.

(57) ABSTRACT

An electrically conductive structure includes a plurality of carbon fiber layers and at least one electrically conductive filament three-dimensionally woven among the carbon fiber layers. The plurality of carbon fiber layers and the at least one electrically conductive filament are operable to conduct electrical current throughout the structure.

19 Claims, 5 Drawing Sheets

ELECTRICALLY CONDUCTIVE STRUCTURE

TECHNICAL FIELD

The disclosure generally relates to structures which dissipate electrical current. More particularly, the disclosure relates to an electrically conductive composite structure throughout which electrically-dissipating materials are three-dimensionally woven to dissipate electrical current along the X, Y and Z axes of the structure.

BACKGROUND

In various applications, composite structures are designed to withstand the currents and voltages of a lightning strike. This capability may be accomplished by spraying on conductive coatings or applying a metallic mesh or screen to the outer surface of the composite structure. While these methods and techniques may be suitable for dissipating electrical current along the X and Y axes (along the surface) of the composite structure, they may not be effective in dissipating electrical current in the Z direction (through the thickness) of the structure. Consequently, electrical current from a lightning strike or electrical short may flow through the composite structure and, if it is allowed to become localized in a specific area, the current may cause damage to the resin binder which secures the carbon fibers of the composite structure together, or the carbon fibers themselves. Therefore, by provision of a current path throughout the composite structure along the X, Y and Z axes, the electrical current does not become localized in the structure.

Nanotechnology has attempted to develop an effective method of providing Z-direction conductivity through a composite material. However, nanotechnology is expensive and inconsistent. Additionally, nanotechnology does not currently provide a three-dimensional lightning protection method for composite materials or structures. If a metallic wire is woven through the material or structure, because the wire has a coefficient of thermal expansion which is greater than that of the rest of the composite perform, the expanding wire induces stresses in the material and lead to micro-cracking. Moreover, if the wire is continuously woven from face to face throughout the fiber form, resin pockets may form within the material since the wire can lock the rest of the fibers in during the manufacturing process or weaving process thus not allowing the fibers to expand or conform during the thermal processing inherent in the resin setting.

Therefore, an electrically conductive structure throughout which electrically-dissipating materials are three-dimensionally woven to dissipate electrical current along the X, Y and Z axes of the structure is needed.

SUMMARY

The disclosure is generally directed to an electrically conductive structure with improved conductivity and electromagnetic dissipation. An illustrative embodiment of the electrically conductive structure includes a plurality of carbon fiber layers and at least one electrically conductive filament three-dimensionally woven among the carbon fiber layers. The plurality of carbon fiber layers and the at least one electrically conductive filament are operable to conduct electrical current throughout the structure.

In some embodiments, the electrically conductive structure with improved conductivity and electromagnetic dissipation may include at least a first carbon fiber layer having a plurality of carbon fiber tows oriented along an X axis and a second carbon fiber layer having a second plurality of carbon fiber tows adjacent to the first carbon fiber layer and oriented along a Y axis; and a plurality of electrically conductive filaments woven among the carbon fiber layers along a Z axis. The carbon fiber tows and the electrically conductive filaments are operable to conduct electrical current throughout the structure.

The disclosure is further generally directed to a method of dissipating an electrical current in a composite structure. An illustrative embodiment of the method includes providing carbon fiber tow layers along X and Y axes; weaving at least one electrically conductive filament among the carbon fiber tow layers and extending along an X axis; pre-impregnating, impregnating, or infusing the carbon fiber tow layers with resin; completing the composite structure by curing the resin; and dissipating electrical current throughout the composite structure along the carbon fiber tow layers and the at least one electrically conductive filament.

BRIEF DESCRIPTION OF THE ILLUSTRATIONS

DETAILED DESCRIPTION

Figure 1:
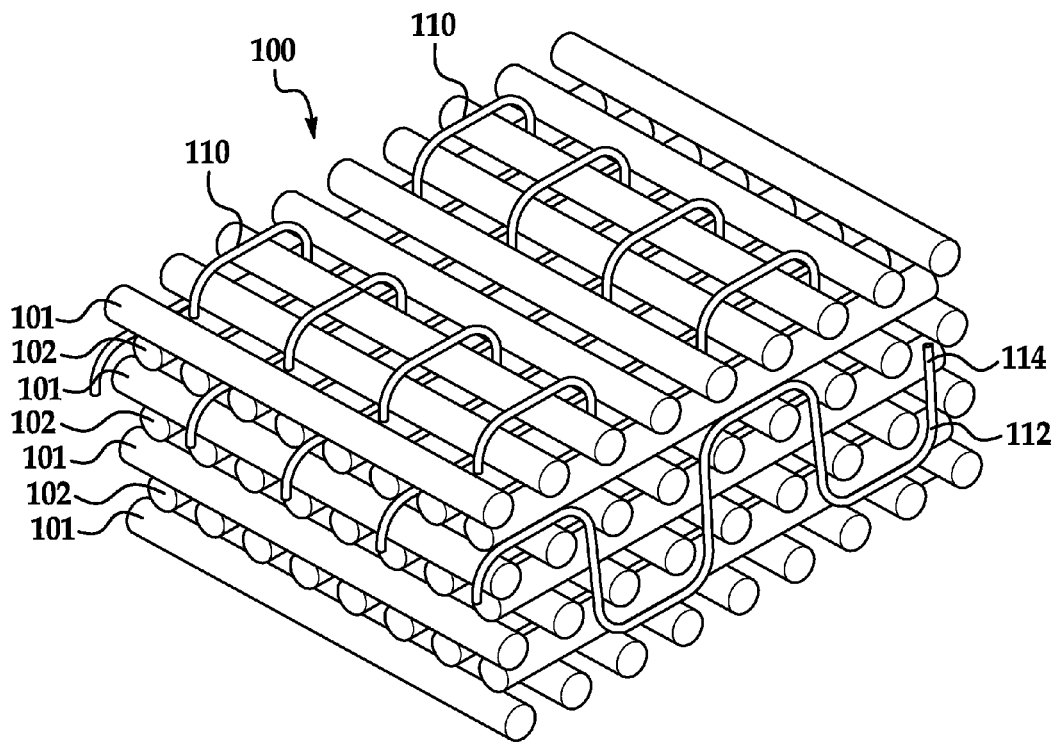
FIG. 1 is a perspective view of an illustrative embodiment of the electrically conductive structure in which heavy carbon fiber tows alternate along the X and Y axes, and an electrically-conductive wire extends along the X axis.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to implement the disclosure and are not intended to limit the scope of the claims. Furthermore, there is no intention to be bound by any expressed or implied theory presented in the preceding technical field, background, brief summary or the following detailed description.

The disclosure is generally directed to an electrically conductive structure and a method of dissipating electrical current in a composite structure by the weaving of electrically conductive filaments along the X, Y and Z axes of the structure. The structure and method may facilitate effective dissipation of electrical current from a lightning strike or other electrical discharge throughout the entire structure. The weaving of electrically conductive filaments along the Z axis of the structure may additionally impart positive structural benefits to the electrically conductive structure.

In some embodiments, the electrically conductive filaments may be woven throughout the matrix of the structure, and therefore, may conduct electrical current continuously along the X, Y and Z axes of the structure. Thus, the electrically conductive filaments may conduct electrical current from edge to edge and from face to face of the structure. In some embodiments, the electrically conductive filaments may not be disposed in electrical contact with each other and may be discontinuous. Accordingly, electrical current may be transferred between electrically conductive filaments in close proximity to each other via electron tunneling, a process which is related to Heisenberg's principles. Electrical current may also be transferred between electrically conductive filaments in close proximity to each other via capacitive coupling. Electrical current may also be transferred between electrically conductive filaments in close proximity to each other via capacitive coupling and HF inductive coupling.

In some embodiments, the electrically conductive filaments may be metallic and each may be a woven, braided or spun fine metallic wire, for example and without limitation. In other embodiments, the electrically conductive filaments may be non-metallic such as a carbon fiber tow, a dry conductive graphite fiber or yarn or a nano-filament, for example and without limitation. Addition of an electrically conductive filament along the Z axis of a composite structure may allow all the various X and Y axis carbon fibers to share the electrical charge or current through the entire depth or thickness of the composite structure, effectively multiplying the current-carrying capacity of the structure according to the number of Z or Y layers. By adding or subtracting the conductive capability of the electrically conductive filaments, the intrinsic current-carrying capability of any panel or section of panel in the structure may be changed, effectively directing such electrical currents toward or away from structure as desired. By weaving the electrically conductive filaments only part of the way through the structure two or three layers at a time, issues such as micro-cracking and resin pooling can be avoided while achieving electrical conductivity throughout the structure. In some embodiments, the electrically conductive filaments may be woven with a greater percentage of the filaments extending in one direction than another direction to impart directionally-varying conductivity to the electrically conductive structure.

The electrically conductive structure may be a ply stack which is pre-impregnated with resin and the resin cured to fabricate composite panels. The composite panels may be incorporated into a higher-order structure such as wing skin on an aircraft, for example and without limitation. In some embodiments, the electrically conductive structures may form plies which are infused with resin after being laid up with other ply sets. Accordingly, a full-thickness composite panel which is formed by the electrically conductive structures may be continuously electrically conductive from edge to edge (along the X and Y axes) as well as from face to face (along the Z axis) of the panel, but the composite panel will not have a continuous fluid leak path through the cured part due to the staggered conductive Z weave.

In some embodiments, each electrically conductive filament may be woven through about 2~4 layers (without limitations) of the structure material and the electrically conductive filaments may be intermixed throughout the material. The layers in which the electrically conductive filaments are woven may be alternated, thus ensuring that elements co-share individual layers of the material within the structure. Individual electrically conductive filaments may not be woven for more than about 2~4 layers (without limitation), thus not restricting the natural expansion and contraction of the structure due to thermal constraints.

Referring initially to FIG. 1, an illustrative embodiment of the electrically conductive structure is generally indicated by reference numeral 100. The electrically conductive structure 100 may include alternating layers or plies of carbon fiber tows 101, 102. In some embodiments, the carbon fiber tows 101 may be heavy carbon fiber tows and the carbon fiber tows 102 may be light carbon fiber tows. The carbon fiber tows 101 may be oriented in generally parallel, spaced-apart relationship to each other. The carbon fiber tows 102 may likewise be oriented in generally parallel, spaced-apart relationship to each other and in generally perpendicular relationship to the carbon fiber tows 101. The carbon fiber tows 101 may be oriented along an X axis. The carbon fiber tows 102 may be oriented along a Y axis.

A first set of Z-direction wires 110 may weave through multiple layers of the carbon fiber tows 101, 102. The first set of Z-direction wires 110 may be oriented in generally parallel, spaced-apart relationship with respect to each other. A second set of Z-direction wires 112 may weave through multiple layers of the carbon fiber tows 101, 102 and may be oriented in generally parallel, spaced-apart relationship with respect to each other. In some embodiments, the first set of Z-direction wires 110 and the second set of Z-direction wires 112 may weave through 2~4 layers of the carbon fiber tows 101, 102. The first set of Z-direction wires 110 and the second set of Z-direction wires 112 may weave through different layers of the carbon fiber tows 101, 102. In some embodiments, the layers of the carbon fiber tows 101, 102 through which the first set of Z-direction wires 110 weave may overlap with the layers of the carbon fiber tows 101, 102 through which the second set of Z-direction wires 112 weave. The first set of Z-direction wires 110 and the second set of Z-direction wires 112 may weave in a "two over, two under" configuration through the carbon fiber tows 101, 102.

At least one X-direction wire 114 may extend through the electrically conductive structure 100 along the X axis. Each X-direction wire 114 may extend between adjacent layers of carbon fiber tows 101, 102. The X-axis direction wires 114 may increase the electrical conductivity of the electrically conductive structure 100 in one layer of the carbon fiber tows 101, 102.

Figure 1A:
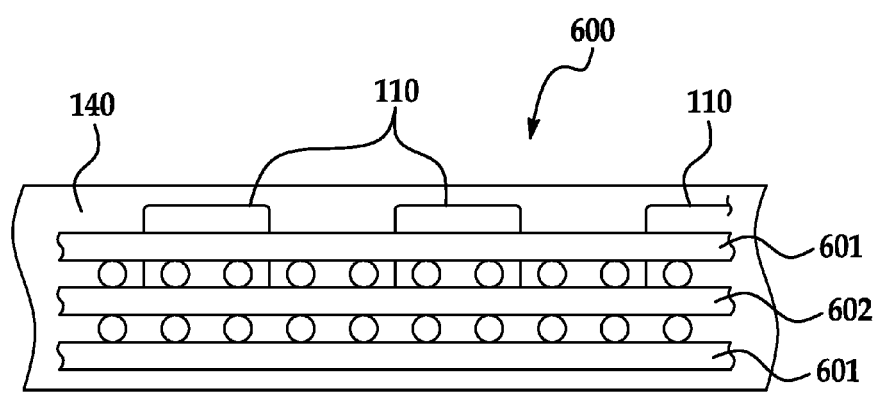
FIG. 1A is a cross-section of an illustrative embodiment of the electrically conductive structure pre-impregnated with resin.

Referring next to FIG. 1A, in exemplary application, the electrically conductive structures 100 may be pre-impregnated with resin 140, cured and used to fabricate full-thickness composite panels (not shown). The composite panels may be incorporated into a higher-order structure such as wing or body skin on an aircraft (not shown), for example and without limitation. In the event of lightning or other electrical discharge to the aircraft, the electrically conductive filaments which may include the carbon fiber tows 101, 102, the Z-direction wires 110, 112 and the X-direction wires 114 absorb the electrical current. The carbon fiber tows 101 distribute the electrical current from edge to edge of the structure 100 along the Y axis. The carbon fiber tows 102 and the X-direction wires 114 distribute the electrical current from edge to edge of the structure 100 along the Y axis. The Z-direction wires 110, 112 distribute the electrical current from one face to the opposite face of the structure 100 along the Z axis. Accordingly, the electrically conductive filaments prevent concentration of the electrical current which may otherwise cause localized damage to the area or areas of the structure 100 in which the current is concentrated.

Figure 2:
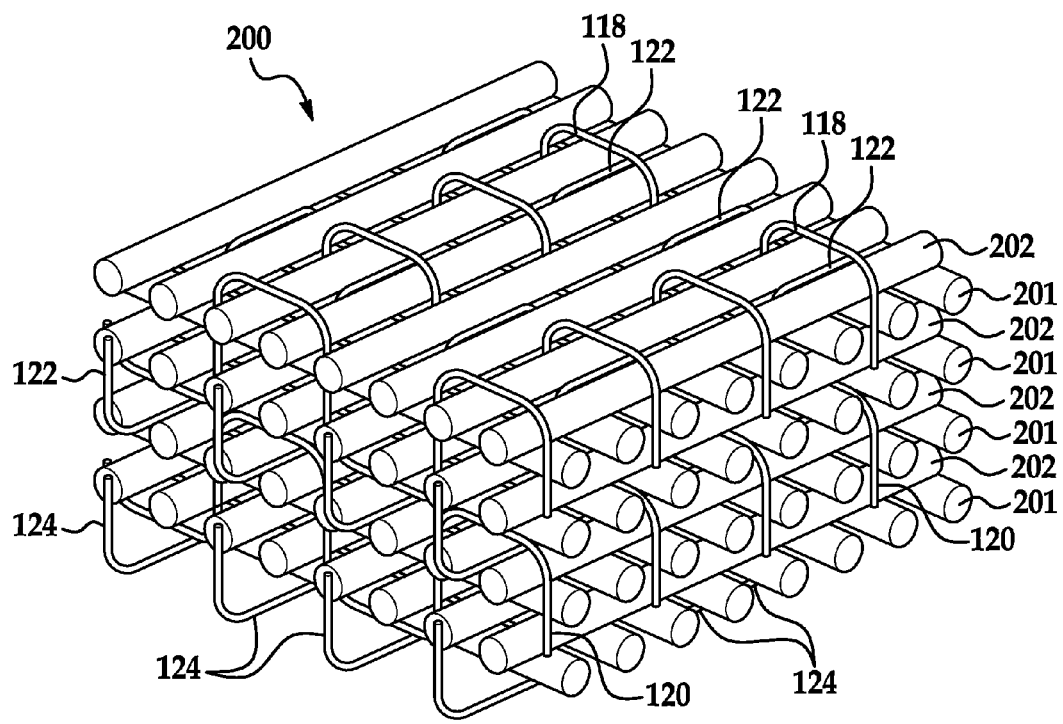
FIG. 2 is a perspective view of an alternative illustrative embodiment of the electrically conductive structure in which a heavy carbon fiber tows alternate along the X and Y axes, a light carbon fiber tow and an electrically-conductive wire extend along the Z axis in a two-under and two-over weave configuration.

Referring next to FIG. 2, an alternative illustrative embodiment of the electrically conductive structure is generally indicated by reference numeral 200. The electrically conductive structure 200 may include alternating layers of carbon fiber tows 201, 202. In some embodiments, the carbon fiber tows 201 may be heavy carbon fiber tows and the carbon fiber tows 202 may be light carbon fiber tows. The carbon fiber tows 201 may be oriented in generally parallel, spaced-apart relationship to each other. The carbon fiber tows 202 may likewise be oriented in generally parallel, spaced-apart relationship to each other and in generally perpendicular relationship to the carbon fiber tows 201. The carbon fiber tows 201 may be oriented along an X axis. The carbon fiber tows 202 may be oriented along a Y axis.

A set of Z-direction tows 118 may weave through multiple layers of the carbon fiber tows 201, 202. The set of Z-direction tows 118 may be oriented in generally parallel, spaced-apart relationship with respect to each other and with respect to the carbon fiber tows 201. A set of Z-direction wires 122 may weave through multiple layers of the carbon fiber tows 201, 202 and may be oriented in generally parallel, spaced-apart relationship with respect to each other and the carbon fiber tows 202. In some embodiments, the set of Z-direction tows 118 and the set of Z-direction wires 122 may weave through 2~4 layers, or any other suitable number of layers, of the carbon fiber tows 201, 202. The set of Z-direction tows 118 may weave over two and under two of the carbon fiber tows 202. The set of Z-direction wires 122 may weave over two and under two of the carbon fiber tows 201 ("two over, two under" configuration).

Figure 3:
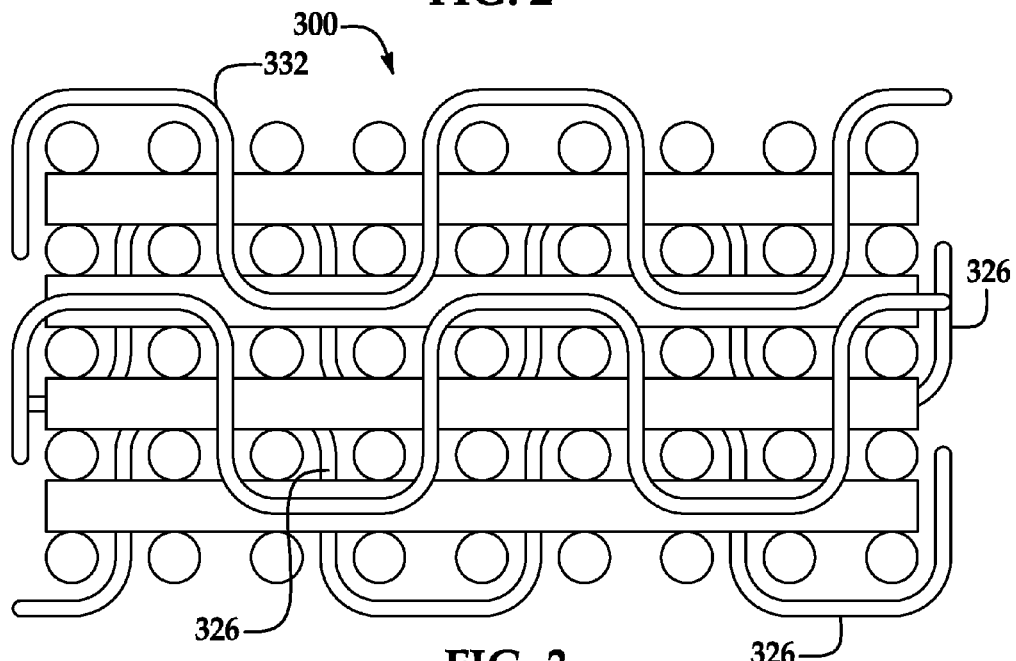
FIG. 3 is a cross-sectional view of another alternative illustrative embodiment of the electrically conductive structure in which electrically-conductive wires are mixed in with heavy carbon fiber tows along the X and Y axes and a light carbon fiber tow along the Z axis.

Referring next to FIG. 3 of the drawings, another alternative illustrative embodiment of the electrically conductive structure is generally indicated by reference numeral 300. The electrically conductive structure 300 may include alternating layers of carbon fiber tows 304, 305. In some embodiments, the carbon fiber tows 304 may be light carbon fiber tows and the carbon fiber tows 305 may be heavy carbon fiber tows. The carbon fiber tows 304 may be oriented in generally parallel, spaced-apart relationship to each other. The carbon fiber tows 305 may likewise be oriented in generally parallel, spaced-apart relationship to each other and in generally perpendicular relationship to the carbon fiber tows 304. The carbon fiber tows 304 may be oriented along an X axis. The carbon fiber tows 305 may be oriented along a Y axis.

At least one set of Z-direction tows 330, 332 may weave through multiple layers of the carbon fiber tows 304, 305. The sets of Z-direction tows 330, 332 may be oriented in generally parallel, spaced-apart relationship with respect to each other and with respect to the carbon fiber tows 305. In some embodiments, the Z-direction tows 330, 332 may be a light tow material. In other embodiments, the Z-direction tows 330, 332 may be a heavy tow material. At least one set of Z-direction wires 326, 328 may weave through multiple layers of the carbon fiber tows 304, 305 and may be oriented in generally parallel, spaced-apart relationship with respect to each other and the carbon fiber tows 305. In some embodiments, the sets of Z-direction tows 330, 332 and the sets of Z-direction wires 326, 328 may weave through 2~4 layers of the carbon fiber tows 304, 305. The sets of Z-direction tows 330, 332 and the sets of Z-direction wires 326, 328 may weave over two and under two of the carbon fiber tows 304. The sets of Z-direction tows 330, 332 may be arranged in offset relationship to the sets of Z-direction wires 326, 328.

Figure 4:
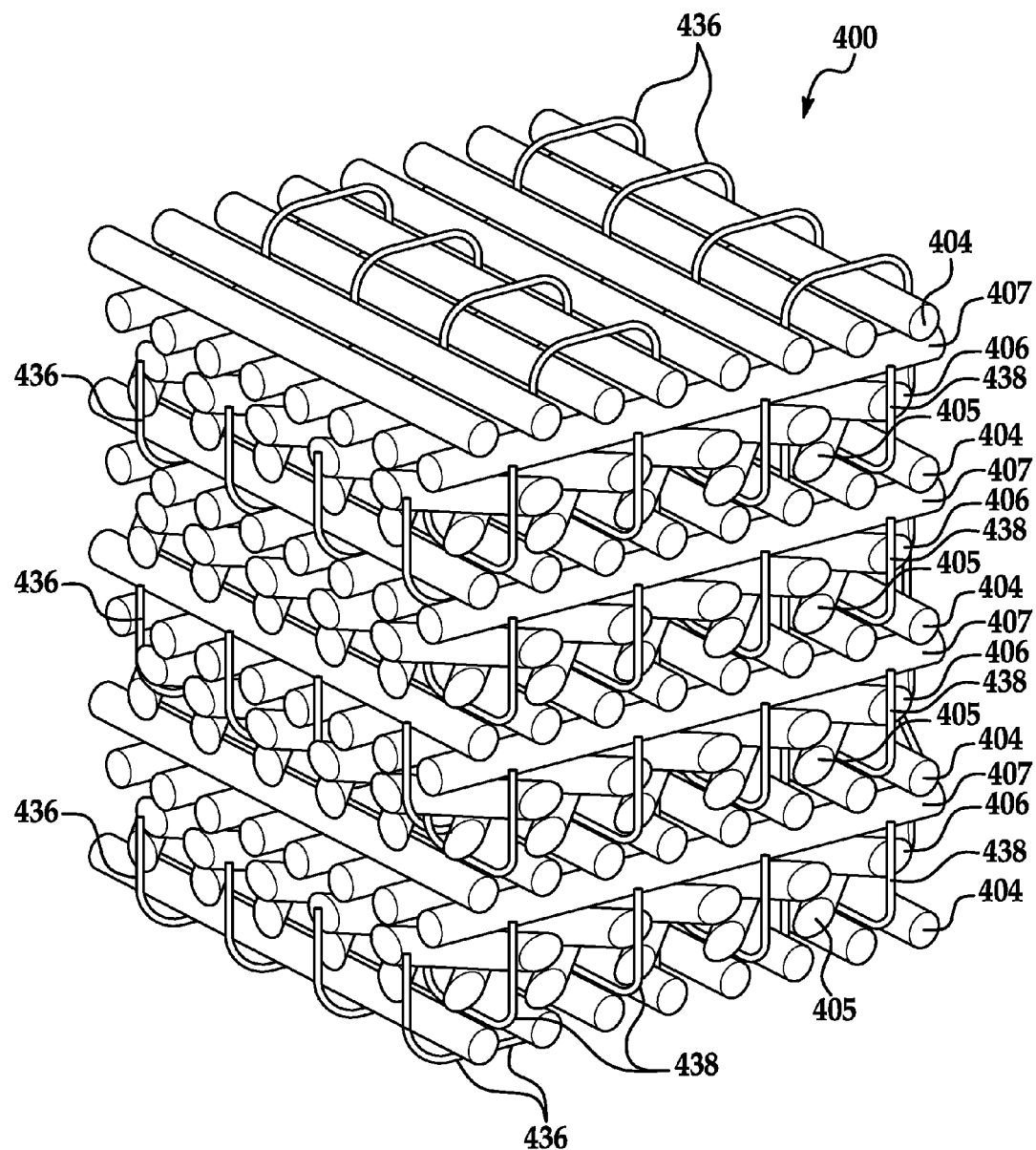
FIG. 4 is a perspective view of yet another alternative illustrative embodiment of the electrically conducive structure in which heavy carbon fiber tows extend along the X, Y and Z axes and two types of electrically-conductive wire extend into two different directions within the Z axis.

Referring next to FIG. 4, another alternative illustrative embodiment of the electrically conductive structure is generally indicated by reference numeral 400. The electrically conductive structure 400 may include alternating layers of carbon fiber tows 404, 405, 406, 407. In some embodiments, the carbon fiber tows 404, 405, 406 and 407 may be heavy carbon fiber tows. The carbon fiber tows 404 may be oriented in generally parallel, spaced-apart relationship to each other. The carbon fiber tows 405, 406 and 407 may likewise be oriented in generally parallel, spaced-apart relationship to each other. The carbon fiber tows 405 may be oriented at an angle (such as a generally 45-degree angle, for example and without limitation) with respect to the carbon fiber tows 404. The carbon fiber tows 406 may be oriented in generally perpendicular relationship with respect to the carbon fiber tows 405. The carbon fiber tows 407 may be oriented at an angle (such as a generally 45-degree angle, for example and without limitation) with respect to the carbon fiber tows 406 and in generally perpendicular relationship with respect to the carbon fiber tows 404.

A set of Z-direction wires 436 may weave through multiple layers of the carbon fiber tows 404, 405, 406 and 407. The set of Z-direction wires 436 may be oriented in generally parallel, spaced-apart relationship with respect to each other and with respect to the carbon fiber tows 407. A set of Z-direction wires 438 may weave through multiple layers of the carbon fiber tows 404, 405, 406 and 407 and may be oriented in generally parallel, spaced-apart relationship with respect to each other and the carbon fiber tows 404. In some embodiments, the set of Z-direction wires 436 and the set of Z-direction wires 438 may weave through 2~4 layers, or any other suitable number of layers, of the carbon fiber tows 404, 405, 406 and 407. The set of Z-direction wires 436 may be disposed in a generally perpendicular relationship with respect to the Z direction wires 438.

It will be appreciated by those skilled in the art that the electrically conductive filaments in the various embodiments of the structures according to the disclosure may conduct electrical current equally upon application of a lightning strike or other electrical current. This capability may minimize edge "glow" as all X and Y electrically conductive filaments may have the same electrical potential. Moreover, the principles of the disclosure can be applied as simple weaves (FIGS. 1 and 2) or more complex weaves (FIGS. 3 and 4) of the electrically conductive filaments. The disclosure is adaptable to multiple weaving processes and can be tailored to the electrically conductive requirements of the structure depending on the particular application of the structure.

Figure 5:
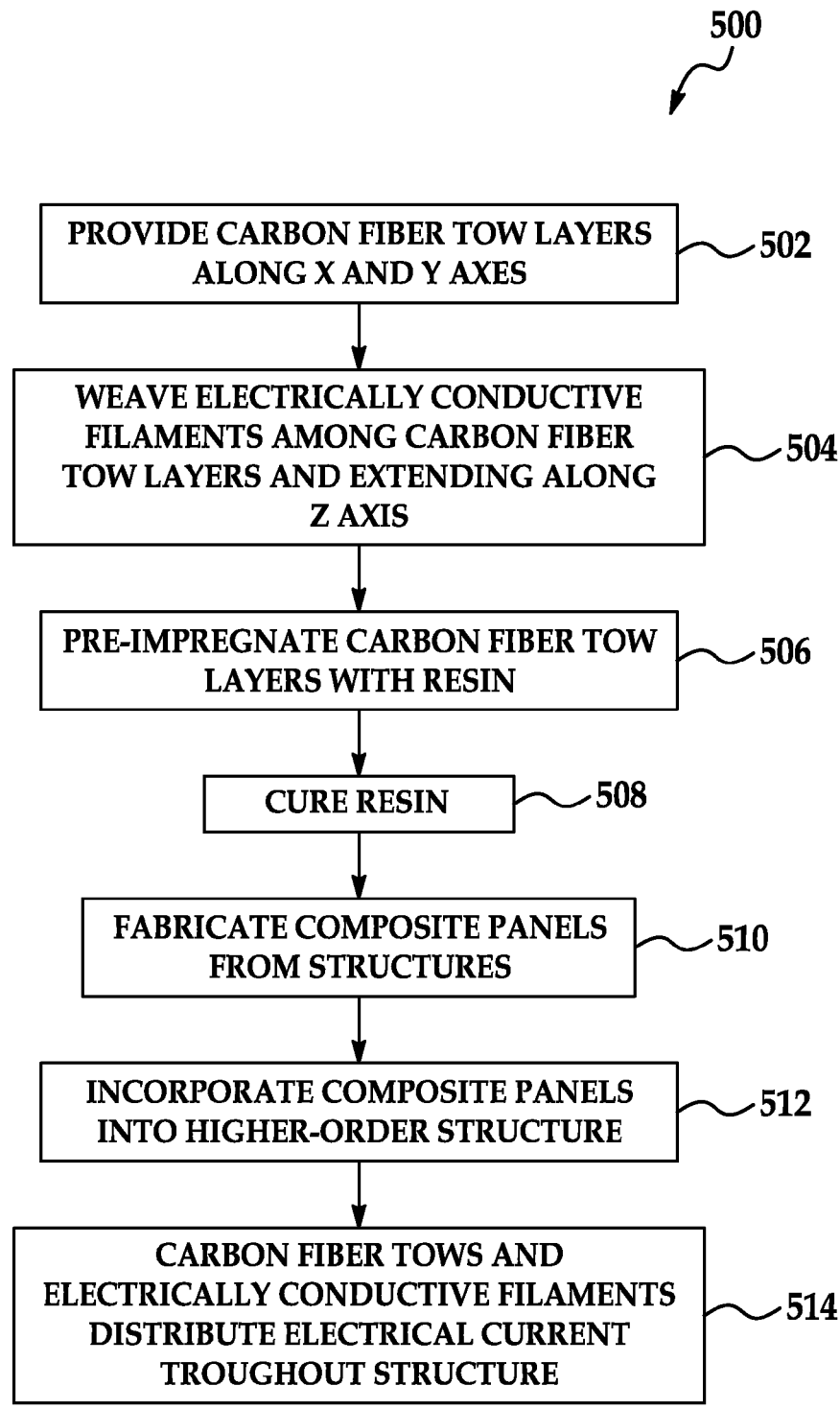
FIG. 5 is a flow diagram of an illustrative embodiment of a method of integrating electrical dissipating material into a composite structure by weaving.

Referring next to FIG. 5, a flow diagram of an illustrative embodiment of a method of dissipating an electrical current in a composite structure is generally indicated by reference numeral 500. In block 502, carbon fiber tow layers may be provided along X and Y axes. In block 504, at least one and typically multiple electrically conductive filaments may be weaved among the carbon fiber tow layers and extend along the Z axis. In block 506, the carbon fiber tow layers may be pre-impregnated with resin. In block 508, the resin may be cured. In block 510, composite panels may be fabricated from the electrically conductive composite structures. In block 512, the composite panels may be incorporated into a higher-order structure such as wing skin on an aircraft, for example and without limitation. In block 514, the carbon fiber tows and the electrically conductive filaments distribute electrical current throughout the structure in the event of a lightning strike or other electrical discharge.

Figure 6:
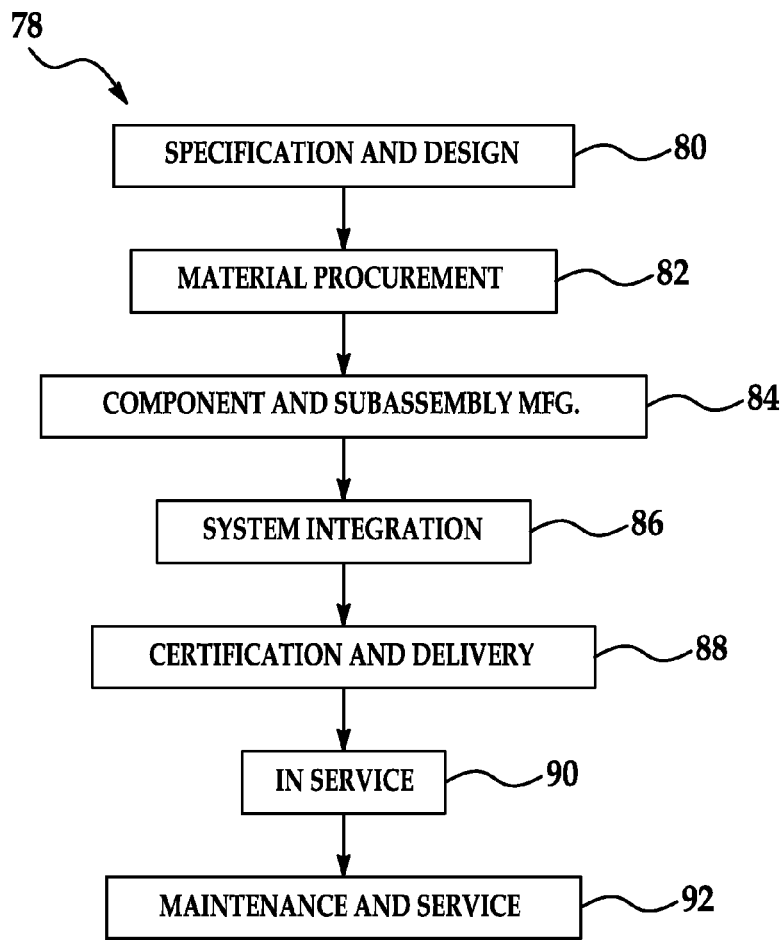
FIG. 6 is a flow diagram of an aircraft production and service methodology.
Figure 7:
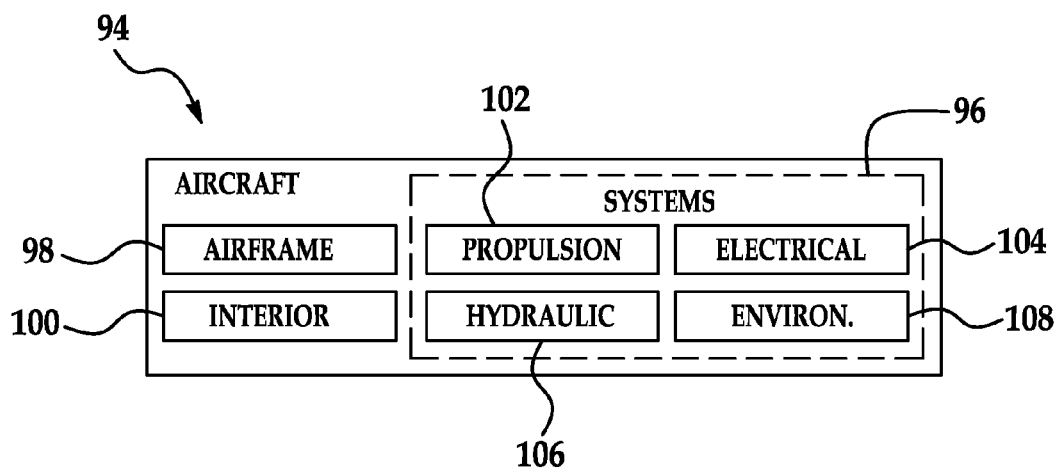
FIG. 7 is a block diagram of an aircraft.

Referring next to FIGS. 6 and 7, embodiments of the disclosure may be used in the context of an aircraft manufacturing and service method 78 as shown in FIG. 6 and an aircraft 94 as shown in FIG. 7. During pre-production, exemplary method 78 may include specification and design 80 of the aircraft 94 and material procurement 82. During production, component and subassembly manufacturing 84 and system integration 86 of the aircraft 94 takes place. Thereafter, the aircraft 94 may go through certification and delivery 88 in order to be placed in service 90. While in service by a customer, the aircraft 94 may be scheduled for routine maintenance and service 92 (which may also include modification, reconfiguration, refurbishment, and so on).

Each of the processes of method 78 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 7, the aircraft 94 produced by exemplary method 78 may include an airframe 98 with a plurality of systems 96 and an interior 100. Examples of high-level systems 96 include one or more of a propulsion system 102, an electrical system 104, a hydraulic system 106, and an environmental system 108. Any number of other systems may be included. Although an aerospace example is shown, the principles of the invention may be applied to other industries, such as the automotive and marine industry. The use of this type of weaving technique would also allow the composite structure to be utilized as an RF (radar, radio) reflector or absorption surface which could find application in airtime, aerospace or military vehicles.

The apparatus embodied herein may be employed during any one or more of the stages of the production and service method 78. For example, components or subassemblies corresponding to production process 84 may be fabricated or manufactured in a manner similar to components or subassemblies produced while the aircraft 94 is in service. Also one or more apparatus embodiments may be utilized during the production stages 84 and 86, for example, by substantially expediting assembly of or reducing the cost of an aircraft 94. Similarly, one or more apparatus embodiments may be utilized while the aircraft 94 is in service, for example and without limitation, to maintenance and service 92.

Although the embodiments of this disclosure have been described with respect to certain exemplary embodiments, it is to be understood that the specific embodiments are for purposes of illustration and not limitation, as other variations will occur to those of skill in the art.

What is claimed is:

1. An electrically conductive structure, comprising:
   a plurality of carbon fiber layers; and
   a plurality of electrically conductive filaments three-dimensionally woven among said plurality of carbon fiber layers, wherein said plurality of electrically conductive filaments are operable to conduct electrical current continuously along a X-axis, a Y-axis, and a Z-axis of said electrically conductive structure;
   wherein the electrically conductive filaments are woven with a greater percentage of the electrically conductive filaments extending in a first direction than a second direction to impart directionally-varying conductivity to the electrically conductive structure;
   wherein the electrically conductive structure comprises one or more of wing skin and body skin on an aircraft;
   wherein the plurality of electrically conductive filaments are discontinuous along the Z-axis of the electrically conductive structure;
   wherein a first portion of the plurality of electrically conductive filaments are continuous along the X-axis and discontinuous along the Y-axis of the electrically conductive structure; and
   wherein a second portion of the plurality of electrically conductive filaments are continuous along the Y-axis and discontinuous along the X-axis of the electrically conductive structure.

2. The electrically conductive structure of claim 1, wherein said plurality of electrically conductive filaments are discontinuous and operable to transfer electrical current between electrically conductive filaments of said plurality of electrically conductive filaments via electron tunneling.

3. The electrically conductive structure of claim 1, wherein said plurality of electrically conductive filaments are discontinuous and operable to transfer electrical current between electrically conductive filaments of said plurality of electrically conductive filaments via capacitive coupling.

4. The electrically conductive structure of claim 1, wherein said plurality of electrically conductive filaments comprises a woven, braided or spun fine metallic wire.

5. The electrically conductive structure of claim 1, wherein said plurality of electrically conductive filaments comprises a dry conductive graphite fiber.

6. The electrically conductive structure of claim 1, wherein said plurality of electrically conductive filaments comprises a carbon nano-filament.

7. The electrically conductive structure of claim 1, wherein said plurality of carbon fiber layers are pre-impregnated with resin.

8. An electrically conductive, electromagnetically dissipative structure, comprising:
   a plurality of carbon fiber layers comprising at least a first carbon fiber layer having a first plurality of carbon fiber tows oriented along an X axis and a second carbon fiber layer having a second plurality of carbon fiber tows adjacent to said first carbon fiber layer and oriented along a Y axis;
   a plurality of electrically conductive filaments woven among said plurality of carbon fiber layers along a Z axis; and
   said plurality of electrically conductive filaments are operable to conduct electrical current throughout said electrically conductive, electromagnetically dissipative structure and along a X-axis, a Y-axis, and a Z-axis of said electrically conductive, electromagnetically dissipative structure;
   wherein the electrically conductive filaments are woven with a greater percentage of the electrically conductive filaments extending in a first direction than a second direction to impart directionally-varying conductivity to the electromagnetically dissipative structure;
   wherein the electromagnetically dissipative structure comprises one or more of wing skin and body skin on an aircraft;
   wherein the plurality of electrically conductive filaments are discontinuous along the Z-axis of the electromagnetically dissipative structure;
   wherein a first portion of the plurality of electrically conductive filaments are continuous along the X-axis and discontinuous along the Y-axis of the electromagnetically dissipative structure; and wherein a second portion of the plurality of electrically conductive filaments are continuous along the Y-axis and discontinuous along the X-axis of the electromagnetically dissipative structure.

9. The electrically conductive, electromagnetically dissipative structure of claim 8, wherein said plurality of electrically conductive filaments are discontinuous and operable to transfer electrical current between electrically conductive filaments of said plurality of electrically conductive filaments via electron tunneling.

10. The electrically conductive, electromagnetically dissipative structure of claim 8, wherein said plurality of electrically conductive filaments are discontinuous and operable to transfer electrical current between electrically conductive filaments of said plurality of electrically conductive filaments via capacitive coupling and HF Inductive coupling.

11. The electrically conductive, electromagnetically dissipative structure of claim 8, wherein said plurality of electrically conductive filaments comprises a woven fine metallic wire.

12. The electrically conductive, electromagnetically dissipative structure of claim 8, wherein said plurality of electrically conductive filaments comprises a dry conductive graphite fiber.

13. The electrically conductive, electromagnetically dissipative structure of claim 8, wherein said plurality of electrically conductive filaments comprises a carbon nano-filament.

14. The electrically conductive, electromagnetically dissipative structure of claim 8, wherein said plurality of carbon fiber layers are preimpregnated with resin.

15. An electrically dissipative composite panel, comprising:
   carbon fiber layers; and
   electrically conductive filaments three-dimensionally woven among the carbon fiber layers, wherein the electrically conductive filaments are continuously electrically conductive along a X-axis, a Y-axis, and a Z-axis of the electrically dissipative composite panel;
   wherein the plurality of electrically conductive filaments are discontinuous along the Z-axis of the electrically conductive structure; wherein a first portion of the plurality of electrically conductive filaments are continuous along the X-axis and discontinuous along the Y-axis of the electrically conductive structure; and wherein a second portion of the plurality of electrically conductive filaments are continuous along the Y-axis and discontinuous along the X-axis of the electrically conductive structure.

16. The electrically dissipative composite panel of claim 15, further comprising a ply stack comprising the carbon fiber layers and a cured resin impregnated in the carbon fiber layers, and wherein the electrically conductive filaments are distributed in the ply stack as a staggered conductive Z weave.

17. The electrically conductive structure of claim 1, wherein individual electrically conductive filaments of the plurality of electrically conductive filaments are woven through greater than or equal to about 2 and less than or equal to about 4 carbon fiber layers of the plurality of carbon fiber layers.

18. The electrically conductive structure of claim 1, wherein the plurality of carbon fiber layers comprises carbon fiber tows and electrically conductive filaments of the plurality of electrically conductive filaments are woven through the carbon fiber tows in a two over, two under configuration through the carbon fiber tows.

19. The electrically conductive structure of claim 1,
   wherein carbon fiber tows of first, fifth, ninth, thirteenth, and seventeenth carbon fiber layers of the plurality of carbon fiber layers are generally perpendicular to carbon fiber tows of second, sixth, tenth, and fourteenth carbon fiber layers of the plurality of carbon fiber layers;
   wherein carbon fiber tows of third, seventh, eleventh, and fifteenth carbon fiber layers of the plurality of carbon fiber layers are generally at a 45 degree angle to the carbon fiber tows of the first, fifth, ninth, thirteenth, and seventeenth carbon fiber layers and the carbon fiber tows of third, seventh, eleventh, and fifteenth carbon fiber layers are generally perpendicular to carbon fiber tows of fourth, eighth, twelfth, and sixteenth carbon fiber layers of the plurality of carbon fiber layers;
   wherein the first carbon fiber layer comprises heavy carbon fiber tows oriented in a parallel spaced-apart relationship and the second carbon fiber layer comprises light carbon fiber tows oriented in a parallel spaced-apart relationship that is perpendicular to the heavy carbon fiber tows;
   wherein the carbon fiber tows and the electrically conductive filaments are configured to distribute electrical current from a lightning strike throughout the structure;
   wherein the weave of the electrically conductive filaments is part way through the structure at one of two, three, and four layers at a time to avoid micro-cracking and resin pooling of the structure while achieving electrical conductivity throughout the structure; and
   wherein the electrically conductive filaments add a conductive capability to the structure and change an intrinsic current-carrying capability of a panel or section of the panel in the structure to direct such electrical currents toward the structure.

\* \* \* \* \*